US009763348B2

(12) United States Patent
Tompkins et al.

(10) Patent No.: US 9,763,348 B2
(45) Date of Patent: Sep. 12, 2017

(54) REMOTE CONTROL UNIT WITH BATTERY RETENTION MECHANISM

(71) Applicant: Oculus VR, LLC, Menlo Park, CA (US)

(72) Inventors: Glen Jason Tompkins, Woodinville, WA (US); Peter Wesley Bristol, Seattle, WA (US); Quintin Morris, Issaquah, WA (US)

(73) Assignee: Oculus VR, LLC, Menlo Park, CA (US)

( * ) Notice: Subject to any disclaimer, the term of this patent is extended or adjusted under 35 U.S.C. 154(b) by 31 days.

(21) Appl. No.: 14/935,358

(22) Filed: Nov. 6, 2015

(65) Prior Publication Data

US 2017/0135236 A1 May 11, 2017

(51) Int. Cl.
*H05K 5/00* (2006.01)
*H05K 5/02* (2006.01)
*H01M 2/10* (2006.01)

(52) U.S. Cl.
CPC ........ *H05K 5/0247* (2013.01); *H01M 2/1044* (2013.01); *H05K 5/0017* (2013.01); *H05K 5/0221* (2013.01); *H01M 2220/30* (2013.01)

(58) Field of Classification Search
CPC combination set(s) only.
See application file for complete search history.

(56) References Cited

U.S. PATENT DOCUMENTS

| 4,574,285 | A | * | 3/1986 | Bascou | ................. | E05B 19/043 |
| | | | | | | 340/12.5 |
| 5,422,783 | A | * | 6/1995 | Darbee | ................. | H04B 1/202 |
| | | | | | | 235/1 D |
| 5,504,658 | A | * | 4/1996 | Matsuda | ............. | H01M 2/1044 |
| | | | | | | 361/807 |
| 5,704,087 | A | | 1/1998 | Strub | | |
| 5,801,918 | A | * | 9/1998 | Ahearn | ............. | G06K 7/10881 |
| | | | | | | 235/472.01 |
| 5,805,423 | A | * | 9/1998 | Wever | .................... | H05K 3/325 |
| | | | | | | 361/760 |
| 6,633,483 | B2 | * | 10/2003 | Akagi | .................. | G06F 1/1613 |
| | | | | | | 361/679.4 |

(Continued)

OTHER PUBLICATIONS

Notice of Preliminary Rejection mailed May 19, 2016 in Korean Patent Application No. 30-2015-0063435 by Bristol, P., et al., filed Dec. 11, 2015.

(Continued)

*Primary Examiner* — Lisa Lea Edmonds
(74) *Attorney, Agent, or Firm* — Perkins Coie LLP

(57) ABSTRACT

Handheld remote control assemblies with battery retention mechanisms are disclosed. An assembly can include a body and with a substantially cylindrical aperture formed in the body and defined by a sidewall. A substantially cylindrical battery is disposed within the aperture, and a latch arm is disposed on one side of the aperture, the latch arm urging the battery toward an opposite side of the aperture. A first tab extends from an upper portion of the latch arm towards the aperture such that the first tab extends partially over an upper surface of the battery. A second tab extends from an upper portion of the sidewall at a position diametrically opposed to the latch arm such that the second tab extends partially over the upper surface of the battery.

18 Claims, 7 Drawing Sheets

(56) References Cited

U.S. PATENT DOCUMENTS

| | | | |
|---|---|---|---|
| 6,988,664 B1* | 1/2006 | Lee | G06K 7/10881 235/462.45 |
| 7,091,899 B2* | 8/2006 | Imamura | G08C 17/00 320/135 |
| D570,793 S | 6/2008 | Ikeda et al. | |
| D571,305 S | 6/2008 | Thursfield et al. | |
| D578,079 S | 10/2008 | Huang et al. | |
| 7,435,508 B2* | 10/2008 | Lee | H01M 2/1027 235/462.45 |
| 7,456,777 B2* | 11/2008 | Piekarz | B60R 11/0264 224/577 |
| D593,509 S | 6/2009 | Glassman et al. | |
| D597,038 S | 7/2009 | Glassman et al. | |
| 7,586,732 B2* | 9/2009 | Myers | F41H 13/0018 361/232 |
| D602,916 S | 10/2009 | Won et al. | |
| D605,177 S | 12/2009 | Madonna et al. | |
| 7,839,627 B2* | 11/2010 | Tanaka | H04M 1/0279 235/472.01 |
| 7,916,460 B2* | 3/2011 | Henty | G08C 17/02 341/22 |
| D645,848 S | 9/2011 | Arnholt et al. | |
| 8,018,726 B2* | 9/2011 | Friedlander | H01H 9/0235 345/156 |
| 8,068,332 B2 | 11/2011 | Yang et al. | |
| 8,072,737 B2* | 12/2011 | Glover | H01H 9/04 150/154 |
| D688,232 S | 8/2013 | Zhang et al. | |
| 8,570,718 B2 | 10/2013 | Gao | |
| D693,332 S | 11/2013 | Lee et al. | |
| D728,530 S | 5/2015 | Shin et al. | |
| D742,361 S | 11/2015 | Choi et al. | |
| 9,176,578 B2 | 11/2015 | Nomura et al. | |
| D746,266 S | 12/2015 | Kwon et al. | |
| D752,025 S | 3/2016 | Akana et al. | |
| D752,555 S | 3/2016 | Langhammer et al. | |
| 9,298,255 B2 | 3/2016 | Kimura | |
| D772,821 S | 11/2016 | Bristol et al. | |
| D790,484 S | 6/2017 | Bristol et al. | |
| 2001/0035442 A1 | 11/2001 | Yokobori et al. | |
| 2003/0201903 A1* | 10/2003 | Shen | H05B 33/0803 340/815.45 |
| 2003/0224243 A1* | 12/2003 | Maeda | H01M 2/1055 429/100 |
| 2004/0196621 A1* | 10/2004 | Nakamura | H01H 9/0235 361/679.01 |
| 2004/0237308 A1 | 12/2004 | Mitchell | |
| 2005/0270735 A1* | 12/2005 | Chen | G06F 1/1632 361/679.55 |
| 2008/0190528 A1 | 8/2008 | Steinberg et al. | |
| 2008/0219657 A1 | 9/2008 | Suzuki et al. | |
| 2009/0156990 A1 | 6/2009 | Wenger | |
| 2009/0185071 A1 | 7/2009 | Suzuki et al. | |
| 2009/0303670 A1* | 12/2009 | Enomoto | H01H 3/161 361/679.01 |
| 2010/0007517 A1 | 1/2010 | Andrews | |
| 2010/0033911 A1 | 2/2010 | Chang et al. | |
| 2010/0102576 A1 | 4/2010 | Zhang et al. | |
| 2010/0118476 A1 | 5/2010 | Li et al. | |
| 2010/0165554 A1 | 7/2010 | Dong et al. | |
| 2010/0191078 A1 | 7/2010 | Yodfat | |
| 2010/0238640 A1 | 9/2010 | Yang | |
| 2010/0304797 A1 | 12/2010 | Yang et al. | |
| 2010/0328857 A1 | 12/2010 | Dong et al. | |
| 2011/0304469 A1 | 12/2011 | Rutter | |
| 2013/0149566 A1 | 6/2013 | Yau | |
| 2013/0176243 A1* | 7/2013 | BianRosa | G06F 3/017 345/173 |
| 2014/0184386 A1 | 7/2014 | Regler | |
| 2015/0022956 A1 | 1/2015 | Olson | |
| 2015/0109721 A1* | 4/2015 | Willcocks | H05B 37/0272 361/679.01 |
| 2015/0138070 A1 | 5/2015 | Iwatsu | |
| 2015/0234189 A1 | 8/2015 | Lyons | |
| 2015/0235435 A1 | 8/2015 | Miller | |
| 2015/0262475 A1 | 9/2015 | Helmy | |
| 2016/0035136 A1 | 2/2016 | Sendai | |
| 2016/0286943 A1 | 10/2016 | Andersen et al. | |
| 2017/0135233 A1 | 5/2017 | Tompkins et al. | |
| 2017/0170446 A1 | 6/2017 | Tompkins et al. | |

OTHER PUBLICATIONS

Blain, L., "'Ancient' Oculus Rift concepts leak new controller and front-facing camera," gamesradar+, retrieved online from <http://www.gamesradar.com/new-oculus-rift-and-its-fancy-new-controller/>,dated Jun. 9, 2015.

Orland, K., "Leaked images could point to Oculus controller, final Rift design," arsTechnica, retreived online from <http://arstechnica.com/gaming/2015/06/leaked-images-could-point-to-oculus-controller-final-rift-design/>, dated Jun. 10, 2015.

Lang, B., "Oculus Rift Input Controller Revealed in Leaked 'Placehold Concept," Road Tovr, retrieved online at <http://www.roadtovr.com/oculus-rift-input-controller-revealed-in-leaked-placeholder-concept/>, dated Jun. 9, 2015.

First Examiner's Report mailed Nov. 19, 2015, for Canadian Patent Application No. 163,149 by Bristol, P. et al., filed Jul. 6, 2015.

First Examiner's Report mailed Apr. 5, 2016, for Canadian Patent Application No. 167,210 by Bristol, P. et al., filed Jul. 6, 2015.

First Examiner's Report mailed Feb. 4, 2016, for Israli Design Patent Application No. 57746 by Bristol, P. et al., filed Nov. 26, 2015.

First Examiner's Report mailed Mar. 18, 2016, for Indian Design Patent Application No. 278169 by Bristol, P. et al., filed Dec. 8, 2015.

First Examiner's Report mailed Mar. 18, 2016, for Indian Design Patent Application No. 278150 by Bristol, P. et al., filed Dec. 7, 2015.

Notification of Reasons for Rejection mailed Apr. 1, 2016 in Japanese Patent Application No. 2015027702 by Bristol, P., et al., filed Dec. 11, 2015.

Notification of Reasons for Rejection mailed Apr. 1, 2016 in Japanese Patent Application No. 2015027703 by Bristol, P., et al., filed Dec. 11, 2015.

U.S. Appl. No. 29/529,911 by Bristol, P., et al., filed Jun. 11, 2015.

U.S. Appl. No. 14/934,102 by Tompkins, G., et al., filed Nov. 5, 2015.

U.S. Appl. No. 14/967,130 by Tompkins, G., et al., filed Dec. 11, 2015.

Restriction Requirement mailed Jun. 17, 2016, for U.S. Appl. No. 29/529,911 by Bristol, P. et al., filed Jun. 11, 2015.

Non-Final Office Action mailed Jul. 28, 2016, for U.S. Appl. No. 14/967,130 by Tompkins, G. et al., filed Dec. 11, 2015.

Notice of Allowance mailed Sep. 8, 2016, for U.S. Appl. No. 29/529,911 by Bristol, P. et al., filed Jun. 11, 2015.

U.S. Appl. No. 29/576,052 by Bristol, P., et al., filed Aug. 31, 2016.

First Examiner's Report mailed Feb. 25, 2016, for Australian Patent Application No. 366114 by Bristol, P. et al., filed Dec. 8, 2015.

First Examiner's Report mailed Feb. 25, 2016, for Australian Patent Application No. 366116 by Bristol, P. et al., filed Dec. 8, 2015.

Non-Final Office Action mailed Mar. 27, 2017 for U.S. Appl. No. 14/934,102 by Tompkins, G., et al., filed Nov. 5, 2015.

Notice of Allowance mailed Mar. 20, 2017, for U.S. Appl. No. 14/967,130 by Tompkins, G. et al., filed Dec. 11, 2015.

Notice of Allowance mailed Mar. 21, 2017 for U.S. Appl. No. 29/576,052 by Bristol, P., et al., filed Aug. 31 2016.

Office Action mailed Mar. 14, 2017 in Mexican Patent Application No. MX/f/2015/003771, by Bristol, P., et al. filed Dec. 11, 2015.

Notice of Preliminary Rejection dated Apr. 11, 2017 in Korean Patent Application No. 30-2016-0048541 by Bristol, P., et al., filed Dec. 11, 2015.

U.S. Appl. No. 29/606,522 by Bristol, P., et al., filed Jun. 5, 2017.

(56) References Cited

OTHER PUBLICATIONS

Corrected Notice of Allowability dated May 5, 2017 for U.S. Appl. No. 29/576,052 by Bristol, P., et al., filed Aug. 31, 2016.

* cited by examiner

REMOTE CONTROL UNIT WITH BATTERY RETENTION MECHANISM

TECHNICAL FIELD

This patent application is directed to wireless electronic mechanisms, including handheld electronic devices with battery retention mechanisms.

BACKGROUND

Handheld electronic devices, such as remote controls, are often powered by one or more replaceable batteries, each typically received in a pocket formed within the device, such that the battery abuts against electrical connection terminals. If the battery moves during operation of the device, it may become dislodged from its position against the connection terminals, thereby interrupting power delivery to the device and negatively affecting its performance.

BRIEF DESCRIPTION OF THE DRAWINGS

Embodiments of the handheld electronic device with a battery retention mechanism introduced herein may be better understood by referring to the following Detailed Description in conjunction with the accompanying drawings, in which like reference numerals indicate identical or functionally similar elements.

Figure 1:
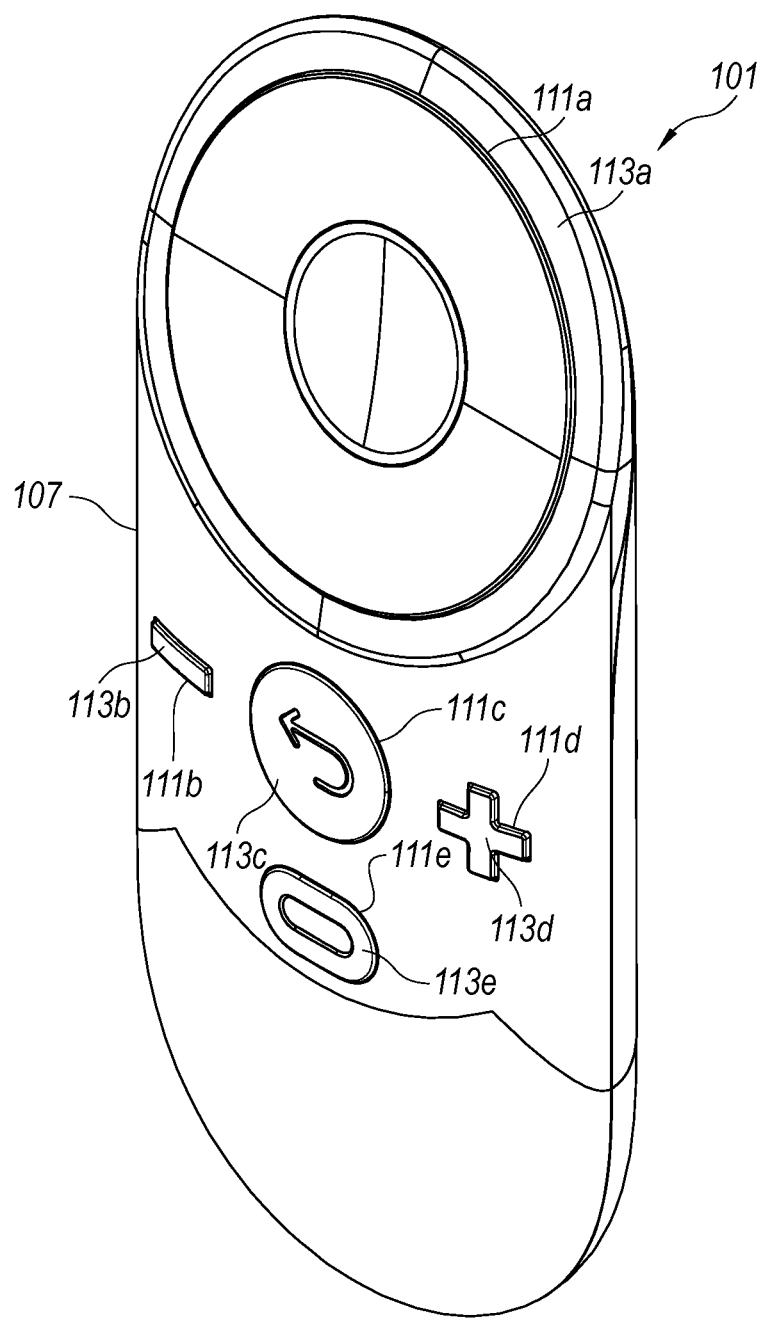
FIG. 1 is an isometric view of a handheld electronic device with a battery retention mechanism in accordance with an embodiment of the present disclosure.
Figure 2:
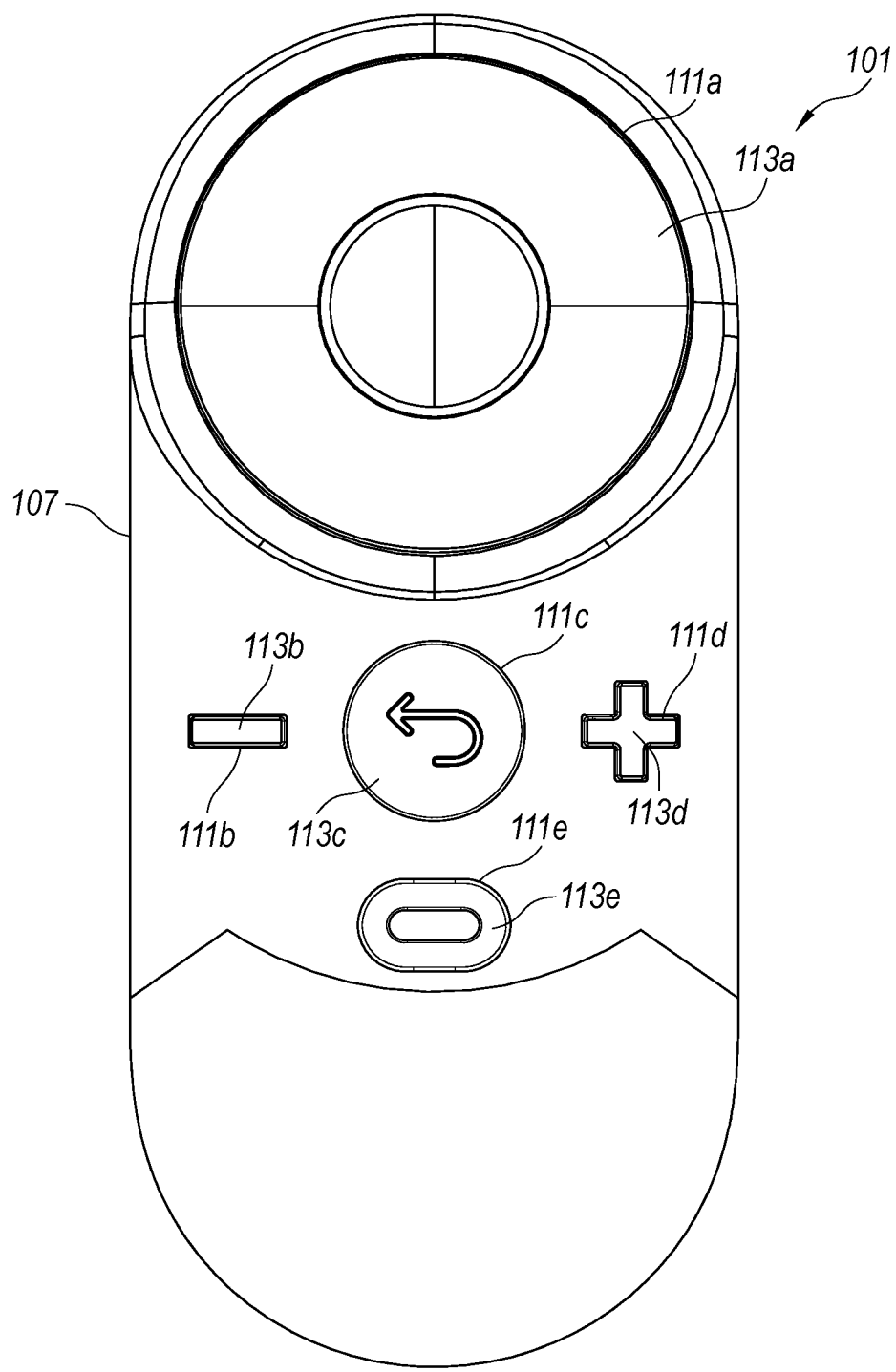
FIG. 2 is a front plan view of the handheld electronic device of FIG. 1.
Figure 3:
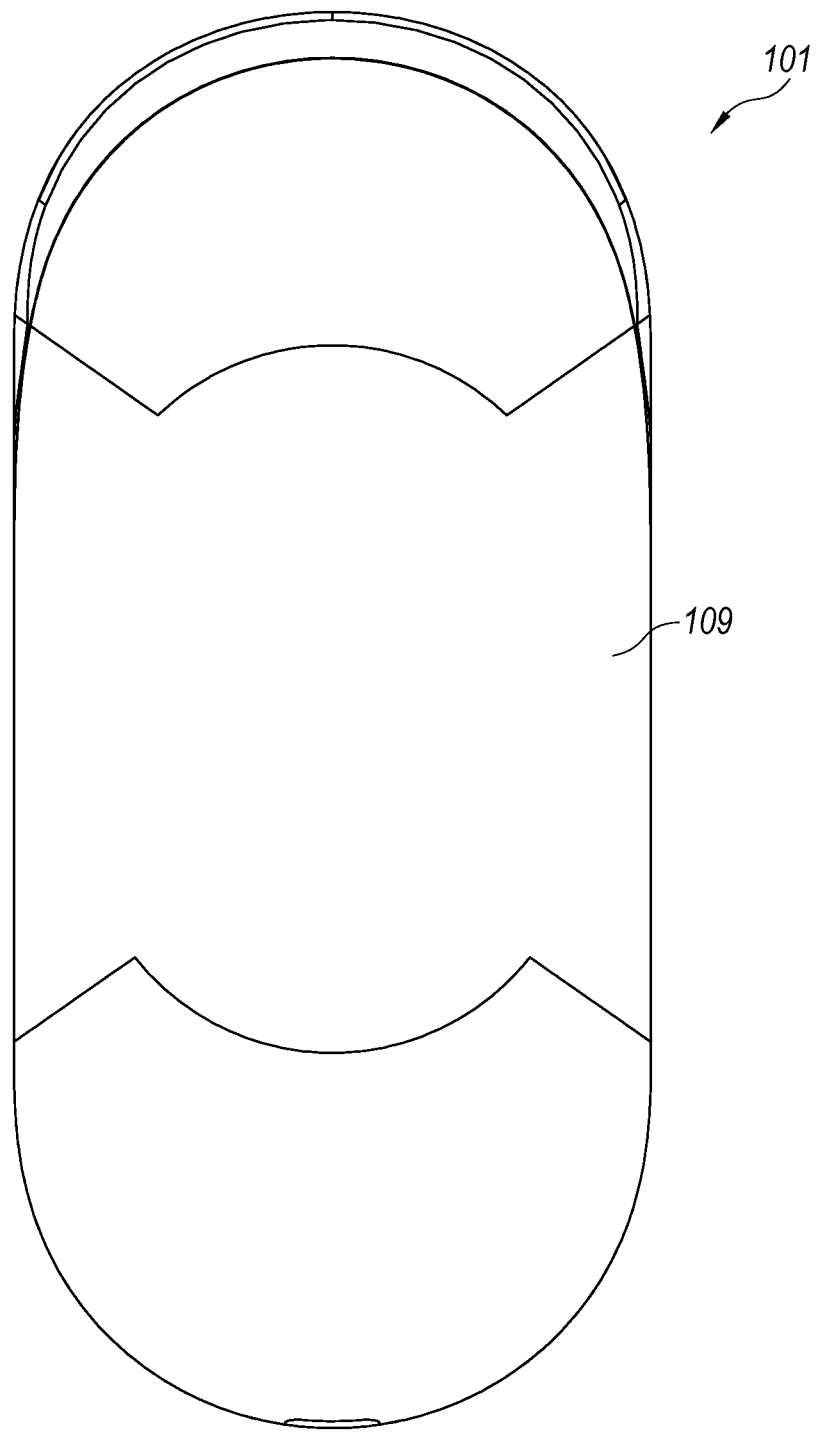
FIG. 3 is a rear plan view of the handheld electronic device of FIGS. 1 and 2.
Figure 4:
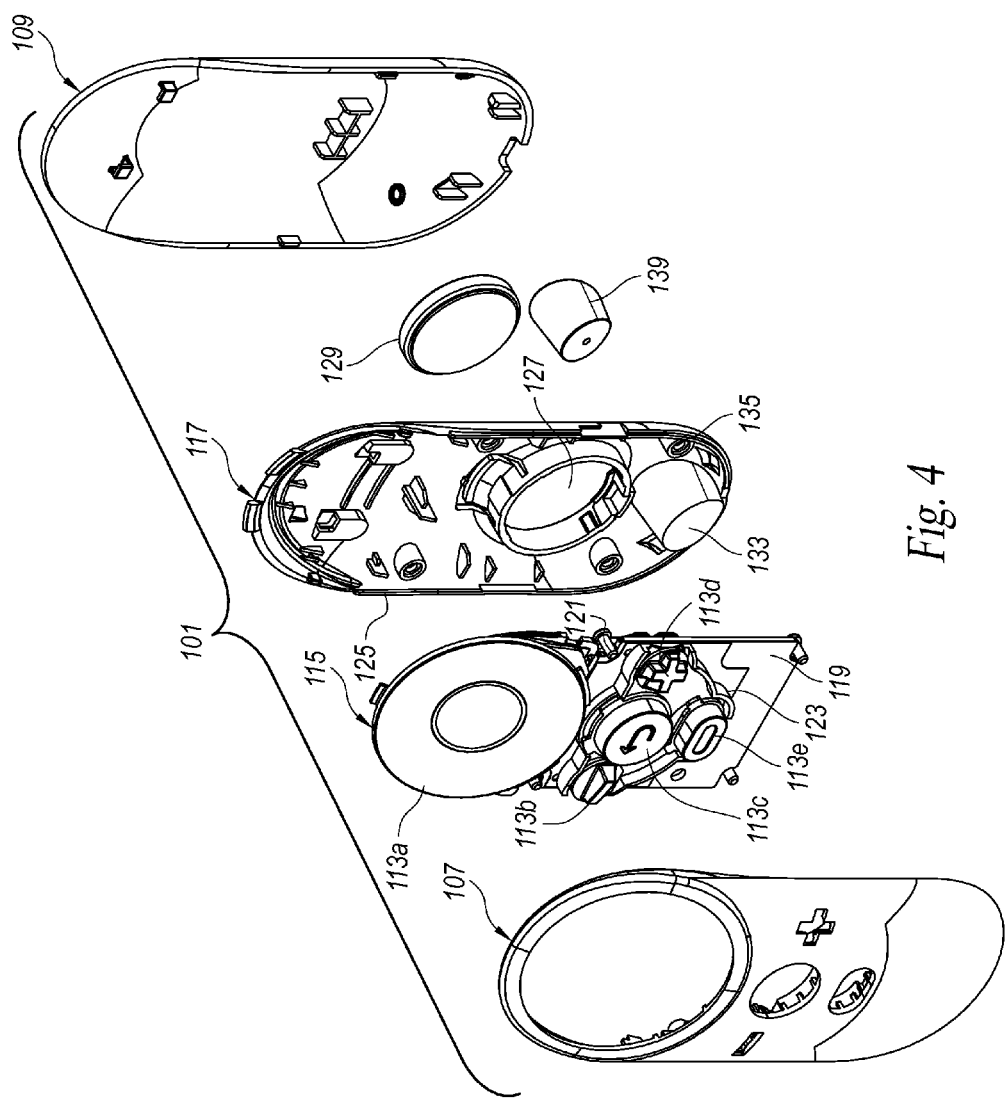
FIG. 4 is a partially exploded isometric view of the handheld electronic device of FIGS. 1-3.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments.

DETAILED DESCRIPTION

Overview

A handheld electronic device with a battery retention mechanism is disclosed. The device includes a cylindrical battery pocket configured to hold a battery. A latch arm is disposed on one side of the cylindrical battery pocket. The latch arm urges a battery placed in the pocket toward the opposite side of the battery pocket. The battery pocket can also include a tab substantially opposite the latch arm to help retain the battery in the pocket.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIGS. 1-4 are isometric, front, rear, and exploded views, respectively, of a handheld electronic device 101. The handheld electronic device 101 is illustrated and described throughout as a remote control device, however in other embodiments the handheld electronic device 101 can take other forms or perform other functions. For example, in some embodiments the handheld electronic device 101 can be any small, portable electronic device, such as a media player, smartphone, camera, an RFID transponder, or other electronic device powered by a removable battery.

Referring to FIGS. 1-4 together, the illustrated device 101 has a substantially oblong-shaped front housing 107 that mates with a corresponding rear housing 109. The front housing 107 includes a plurality of openings 111a-e that receive, respectively, a plurality of user input controls 113a-e therethrough. For example, the first user input control 113a can include a touch-sensitive surface that allows a user to provide input via touching or moving the user's finger across a touch-sensitive surface of the control 113a, and/or by depressing a button portion of the control 113a. Second and third user input controls 113b and 113c are volume-down and volume-up buttons, respectively, while the fourth user input control 113d provides a return or "back" function. The fifth user input control 113e is a power button. In other embodiments the user input controls can take a variety of configurations, including other touch-sensitive surfaces, depressible-buttons, or any other input mechanism.

Sandwiched between the front housing 107 and the rear housing 109 are an internal control assembly 115 and a support body portion 117. The internal control assembly 115 includes the plurality of input controls 113a-e on a front side 119 that faces toward the front housing 107. The control assembly 115 can include a printed circuit board 123, carrying associated electronics configured to process user input provided via the controls 113a-e and perform various other electronic functions of the device 101.

The support body portion 117 has a front side 125 that mates with the internal control assembly 115. The support body portion 117 also includes a lanyard receptacle 133 formed in a back side 135 of the support body portion 117 adjacent to the aperture 127. A lanyard anchor 139 is configured to be removably received within the lanyard receptacle 133. The lanyard anchor 139 and the lanyard receptacle 133 are described in more detail in U.S. application Ser. No. 14/934,102, filed Nov. 5, 2015, which is hereby incorporated by reference in its entirety. The support body portion 117 further includes an aperture 127 that provides access to a portion of the backside 121 of the control assembly 115 having connection terminals 131a, 131b (FIGS. 5-7) that releasably receive a battery 129. When assembled, the aperture 127 and the back 121 of the control assembly 115 can together define a battery pocket 140 configured to receive the battery 129 therein. Accordingly, the battery 129 can be installed through the aperture 127 when the rear housing 109 is removed from the support body portion 117.

Figure 5:
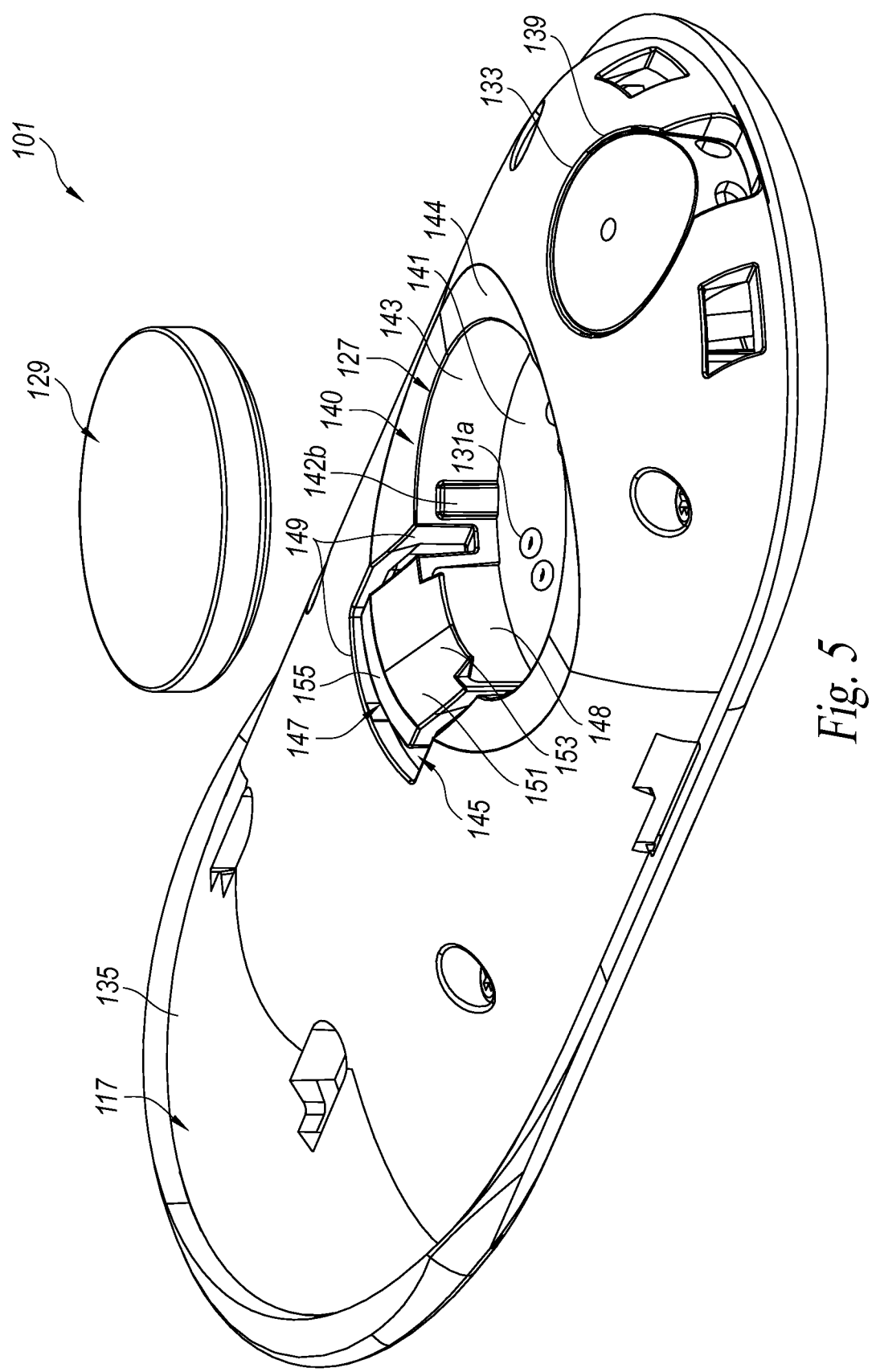
FIG. 5 is a partially exploded rear isometric view of the handheld electronic device of FIGS. 1-4 with the rear housing not shown for purposes of clarity.
Figure 6:
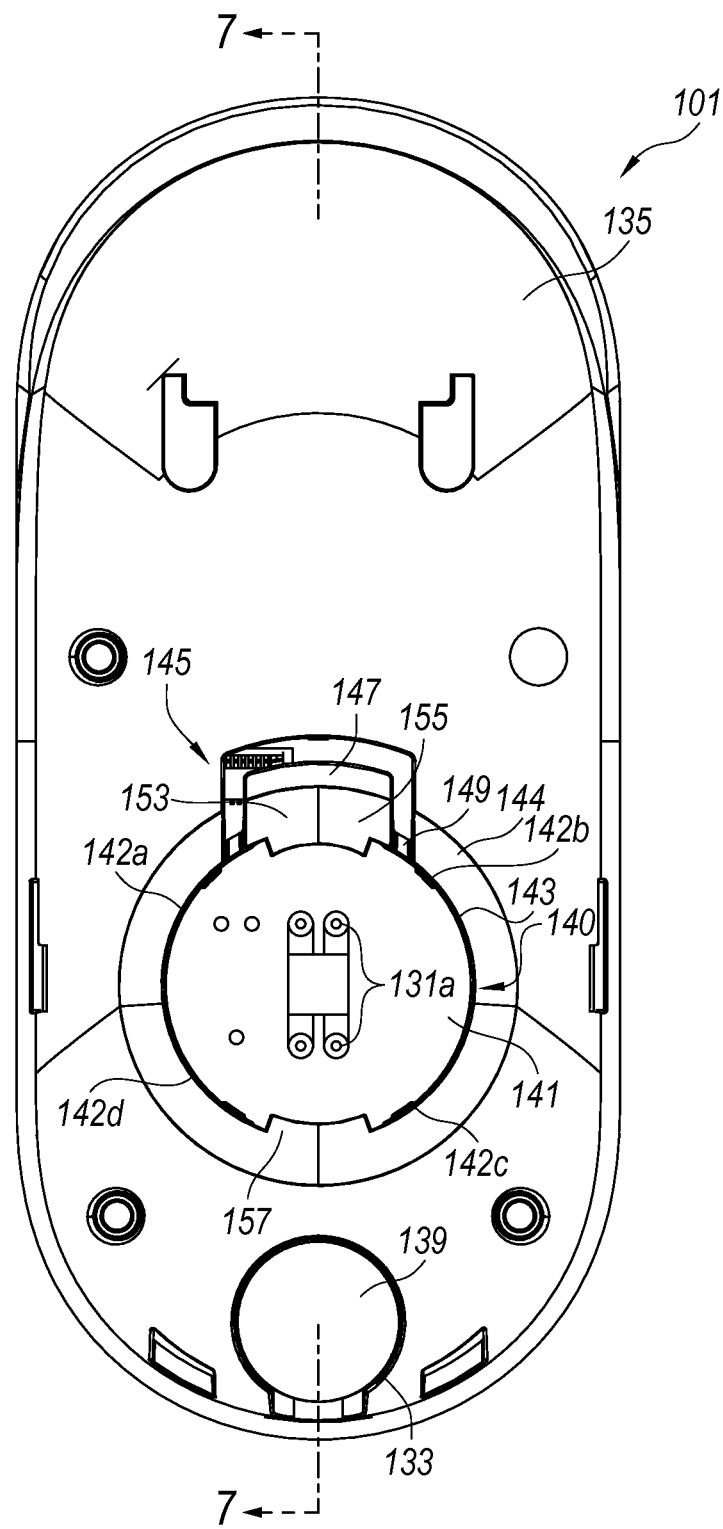
FIG. 6 is a plan rear view of the handheld device of FIG. 5 with the rear housing and battery not shown for purposes of clarity.
Figure 7:
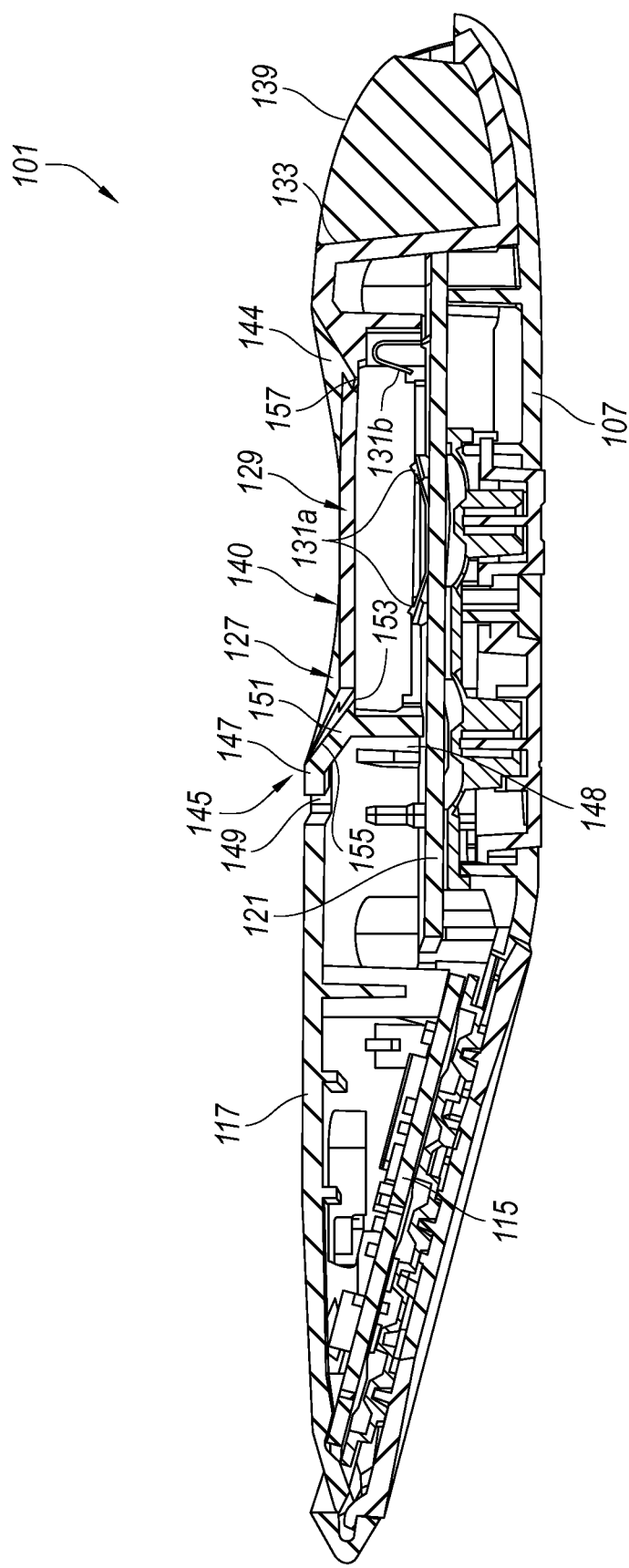
FIG. 7 is a side cross-sectional view of the handheld electronic device of FIG. 6 taken substantially along lines 7-7.

FIG. 5 is a rear perspective view of the device 101 with the rear housing 109 removed and the battery 129 separated from the aperture 127. FIG. 6 is a rear plan view of the device 101 with the rear housing 109 and battery 129 removed. FIG. 7 is a side cross-section of the device 101 with the rear housing 109 removed. Referring to FIGS. 5-7 together, the battery 129 of the illustrated embodiment is a button-cell style battery with a squat, substantially cylindrical shape, and the aperture 127 has a corresponding substantially cylindrical shape. The battery pocket 140 has a corresponding substantially cylindrical shape. The battery pocket 140 is defined by a lower surface 141 and a sidewall 143 extending away from the lower surface 141. A plurality of ribs 142a-d protrude radially inwardly from the sidewall 143 of the battery pocket 140. As described in more detail below, these ribs 142a-d can guide and retain the battery 129 in position within the battery pocket 140. The ribs 142a-d can be substantially equally spaced around the perimeter of the battery pocket 140. In the illustrated device 101, there are four ribs 142a-d, however in other embodiments the number of ribs can vary, for example the device can have two, three, five, or more ribs.

The lower surface 141 is part of the backside 121 of the control assembly 115. The first connection terminal 131a is disposed at a first, substantially central location on the lower surface 141, and the second connection terminal 131b (FIG. 7) is disposed at a second location on the lower surface 141, adjacent to the sidewall 143 of the battery pocket 140. The first and second connection terminals 131a and 131b are disposed in positions to engage respective positive and negative terminals or other connection portions of the battery 129. When the battery 129 is disposed within the battery pocket 140, portions of the battery 129 are in electrical connection with the first connection terminal 131a and the second connection terminal 131b, thereby enabling the battery 129 to power the device 101.

A latch mechanism 145 secures the battery 129 in position within the battery pocket 140. The latch mechanism 145 includes a latch arm 147 that is separated from adjacent portions of the sidewall 143 by a gap 149. In some embodiments, the latch mechanism 145 is integrally formed with the sidewall 143, while in other embodiments the latch mechanism 145 and the sidewall 143 can be physically separate. The gap 149 adjacent to the latch arm 147 permits a lower portion 148 of the latch arm 147 to flex such that the upper portion 151 of the latch arm 147 can move radially with respect to adjacent portions of the sidewall 143. The gap 149 extends toward the lower surface 141 along a portion of the sidewall 143 but does not reach the lower surface 141 so that the lower portion 148 of the latch arm 147 can be integrally formed with the adjacent sidewall 143, and provide a fixed portion against which the upper portion 151 of the latch arm 147 can move. In other embodiments the gap 149 can extend completely to the lower surface 141 such that the latch arm 147 is completely separated from the adjacent portions of the sidewall 143.

The latch arm 147 includes a first tab 153 that extends from a sloped upper surface 155 of the latch arm 147 at a position most proximal to the aperture 127. During insertion, the battery 129 can be pressed downward on the sloped upper surface 155 of the latch arm 147, which causes the latch arm 147 to flex so the first tab 153 moves radially away from the aperture 127, thereby temporarily moving the latch arm 147 and the first tab 153 out of the way and allowing the battery 129 sufficient room to be inserted into the aperture 127. Once the battery 129 is in place, the latch arm 147 springs back into place, with the first tab 153 extending over a portion of the battery 129, thereby holding the battery 129 in contact with the first connection terminal 131a.

As noted above, the ribs 142a-d project from the sidewall 143 of the battery pocket 140 and serve to center the battery 129 with respect to the battery pocket 140. When installed within the battery pocket 140, the battery 129 is in contact with the ribs 142a-d. When the latch arm 147 is pulled away from the battery 129, the battery 129 remains in contact with the ribs 142a-d, thereby preventing the battery from following the latch arm 147 as it is pulled away from the battery pocket 140. Accordingly, the only portion of the latch mechanism 145 that directly contacts the battery 129 is the first tab 153. In other embodiments, other portions of the latch mechanism 145 can contact the battery 129.

The support body portion 117 further includes a sloped perimeter portion 144 adjacent to the aperture 127. The sloped perimeter portion 144 slopes inwardly towards the aperture 127, and can have a slope and orientation to correspond to the sloped upper surface 155 of the latch arm 147. The sloped perimeter portion 144 and the sloped upper surface 155 can aid in insertion of the battery 129 into the aperture 127, as pressing downward on the battery 129 in position over any part of the sloped perimeter portion 144 or the sloped upper surface 155 will urge the battery 129 into the aperture 127.

As seen in FIG. 6, a second tab 157 extends away from an upper portion of the sidewall 143 of the aperture 127 at a position substantially opposite the latch arm 147. The second tab 157 is spaced above the upper surface of the battery 129 when received within the battery pocket 140, and defines a shoulder that overlaps the edge portion of the battery 129 to block the battery 129 from moving upwardly out of the battery pocket 140. The second tab 157 can be configured similarly to the first tab 153 of the latch arm 147. When the battery 129 is fully inserted into the aperture 127, the first tab 153 and the second tab 157 both extend over portions of the upper surface of the battery 129, thereby retaining the battery 129 in place within the aperture 127. Once the battery 129 is in place within the battery pocket 140, the rear housing 109 (FIGS. 1-4) can be placed over the support body portion 117, thereby covering the battery pocket 140 and the battery 129.

To remove the battery 129, the rear housing 109 can be removed to expose the battery pocket 140 and the battery 129. Next, the latch arm 147 can be flexed and manually moved radially away from the aperture 127. The latch arm 147 has a sloped engagement surface 155 against which a user can push his/her finger to cause the latch arm 147 to flex and move radially. The sloped engagement surface 155 can include textured or grip features to allow the user to maintain positive engagement with the latch arm 147. Radial movement of the latch arm 147 can continue until the first tab 153 does not extend over any portion of the battery 129, at which point one side of the battery can be lifted up from the battery pocket 140. The other side of the battery 129, disposed opposite the latch arm 147 and under the second tab 157, can then be slid out from underneath the second tab 157 and the battery 129 can be completely removed from the battery pocket 140. Accordingly, the battery pocket 140, the latch mechanism 145, and the second tab 157 together provide a retention mechanism that enables the battery 129 to be quickly and easily inserted into and removed from the device 101, while securely retaining the battery 129 during operation.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

We claim:

1. A handheld remote control assembly, comprising:
   a body;
   a substantially cylindrical aperture formed in the body and defined by a sidewall;
   a substantially cylindrical battery disposed within the aperture;
   a latch arm disposed on one side of the aperture, the latch arm urging the battery toward an opposite side of the aperture;
   a first tab extending from an upper portion of the latch arm towards the aperture such that the first tab extends partially over an upper surface of the battery, wherein the first tab is movable between a first position over the battery to block removal of the battery and a second position away from the battery to allow for removal of the battery; and
   a second tab extending from an upper portion of the sidewall at a position diametrically opposed to the latch arm such that the second tab extends partially over the upper surface of the battery.

2. The assembly of claim 1, wherein the body comprises a perimeter portion surrounding the aperture, the perimeter portion sloping inwardly toward the aperture.

3. A handheld remote control assembly, comprising:
   a battery; and
   a device comprising:
      a body;
      an aperture formed in the body, the battery retained in the aperture in an installed position; and
      a latch arm disposed on one side of the aperture, the latch arm releasably retaining the battery in the aperture and urging the battery toward an opposite side of the aperture,
      wherein the body comprises a perimeter portion surrounding the aperture, the perimeter portion sloping inwardly toward the aperture.

4. The assembly of claim 3 wherein the aperture is substantially cylindrical and wherein the battery has a corresponding substantially cylindrical shape.

5. The assembly of claim 3 further comprising a first tab extending from an upper portion of the latch arm towards the aperture such that the tab extends partially over an upper surface of the battery when the battery is retained in the aperture in the installed position.

6. The assembly of claim 5 wherein the aperture is defined by a sidewall, the assembly further comprising a second tab extending from an upper portion of the sidewall at a position substantially opposite the latch arm.

7. The assembly of claim 3 wherein the aperture is defined by a sidewall, and wherein the latch arm is integrally formed with the sidewall.

8. The assembly of claim 3 wherein the aperture defines an opening exposing a lower surface, the assembly further comprising an electrical connection terminal disposed on the lower surface.

9. The assembly of claim 3, further comprising a rear housing that covers the aperture and the battery.

10. A handheld remote control assembly, comprising:
    a battery; and
    a device comprising:
       a body;
       an aperture formed in the body, the battery retained in the aperture in an installed position; and
       a latch arm disposed on one side of the aperture, the latch arm releasably retaining the battery in the aperture and urging the battery toward an opposite side of the aperture,
       wherein the latch arm further comprises an upper surface that is sloped inwardly towards the aperture such that downward pressure on the upper surface causes the latch arm to flex away from the aperture.

11. A handheld remote control assembly configured to receive power from a battery, comprising:
    a body;
    an aperture formed in the body, the aperture configured to receive the battery therein;
    a latch arm disposed on one side of the aperture, the latch arm configured to removably retain a battery within the aperture; and a rear housing covering the aperture, wherein the body comprises a perimeter portion surrounding the aperture, the perimeter portion sloping inwardly toward the aperture.

12. The assembly of claim 11 wherein the aperture is substantially cylindrical.

13. The assembly of claim 11 further comprising a first tab extending from an upper portion of the latch arm towards the aperture such that the tab extends partially over an upper surface of the battery when the battery is retained in the aperture in the installed position.

14. The assembly of claim 13 wherein the aperture is defined by a sidewall, the assembly further comprising a second tab extending from an upper portion of the sidewall at a position diametrically opposed to the latch arm.

15. The assembly of claim 11 wherein the aperture is defined by a sidewall, and wherein the latch arm is integrally formed with the sidewall.

16. The assembly of claim 11 wherein the aperture is defined by a sidewall and exposes a lower surface, the assembly further comprising an electrical connection terminal disposed on the lower surface.

17. The assembly of claim 11, further comprising a battery disposed within the aperture.

18. A handheld remote control assembly configured to receive power from a battery, comprising:

a body;

an aperture formed in the body, the aperture configured to receive the battery therein;

a latch arm disposed on one side of the aperture, the latch arm configured to removably retain a battery within the aperture; and a rear housing covering the aperture, wherein the latch arm further comprises an upper surface that is sloped inwardly towards the aperture such that downward pressure on the upper surface causes the latch arm to flex away from the aperture.

* * * * *